(12) United States Patent
Wang et al.

(10) Patent No.: US 7,172,792 B2
(45) Date of Patent: *Feb. 6, 2007

(54) METHOD FOR FORMING A HIGH QUALITY LOW TEMPERATURE SILICON NITRIDE FILM

(75) Inventors: Shulin Wang, Campbel, CA (US); Errol Antonio C. Sanchez, Dublin, CA (US); Aihua Chen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 396 days.

This patent is subject to a terminal disclaimer.

(21) Appl. No.: 10/327,467

(22) Filed: Dec. 20, 2002

(65) Prior Publication Data

US 2004/0121085 A1    Jun. 24, 2004

(51) Int. Cl.
*C23C 16/34* (2006.01)

(52) U.S. Cl. .............. 427/255.393; 427/255.394; 427/533; 427/535

(58) Field of Classification Search .......... 427/533, 427/535, 255.394
See application file for complete search history.

(56) References Cited

U.S. PATENT DOCUMENTS

| | | | |
|---|---|---|---|
| 4,158,717 A | | 6/1979 | Nelson |
| 4,857,140 A | | 8/1989 | Lowenstein |
| 4,883,686 A | * | 11/1989 | Doehler et al. ............ 427/562 |
| 4,992,299 A | | 2/1991 | Hochberg et al. |
| 4,992,306 A | | 2/1991 | Hochberg et al. |
| 5,264,724 A | * | 11/1993 | Brown et al. ............... 257/347 |
| 5,273,920 A | * | 12/1993 | Kwasnick et al. .......... 438/158 |
| 5,380,566 A | * | 1/1995 | Robertson et al. ......... 427/534 |
| 5,562,952 A | * | 10/1996 | Nakahigashi et al. ...... 427/534 |
| 5,591,494 A | | 1/1997 | Sato et al. |
| 5,632,821 A | * | 5/1997 | Doi ............................ 134/1.1 |
| 6,001,431 A | * | 12/1999 | Itoh et al. .................. 427/569 |
| 6,017,784 A | * | 1/2000 | Ohta et al. ................. 438/197 |
| 6,087,205 A | * | 7/2000 | Yamamori .................. 438/158 |
| 6,224,950 B1 | * | 5/2001 | Hirata ........................ 427/535 |
| 6,303,777 B1 | * | 10/2001 | Kao et al. .................. 536/119 |
| 6,324,439 B1 | | 11/2001 | Cheung et al. |
| 6,348,420 B1 | | 2/2002 | Raaijmakers et al. |

(Continued)

FOREIGN PATENT DOCUMENTS

JP    62-051264    3/1987

(Continued)

OTHER PUBLICATIONS

PCT International Search Report for PCT/US03/40793, dated Jun. 30, 2004 (AMAT/7785.PC.02).

(Continued)

*Primary Examiner*—Bret Chen
(74) *Attorney, Agent, or Firm*—Patterson & Sheridan, LLP

(57) ABSTRACT

A method of forming a silicon nitride film is described. According to the present invention, a silicon nitride film is deposited by thermally decomposing a silicon/nitrogen containing source gas or a silicon containing source gas and a nitrogen containing source gas at low deposition temperatures (e.g., less than 550° C.) to form a silicon nitride film. The thermally deposited silicon nitride film is then treated with hydrogen radicals to form a treated silicon nitride film.

43 Claims, 5 Drawing Sheets

U.S. PATENT DOCUMENTS

| | | | |
|---|---|---|---|
| 6,413,887 B1 | 7/2002 | Fukuda et al. | |
| 6,468,903 B2 | 10/2002 | Bolscher et al. | |
| 6,524,955 B2 | 2/2003 | Fukuda et al. | |
| 6,544,900 B2 | 4/2003 | Raaijmakers et al. | |
| 6,555,183 B2* | 4/2003 | Wang et al. | 427/535 |
| 6,583,046 B1* | 6/2003 | Okada et al. | 438/622 |
| 6,586,163 B1 | 7/2003 | Okabe et al. | |
| 6,630,413 B2 | 10/2003 | Todd | |
| 7,091,138 B2* | 8/2006 | Numasawa et al. | 438/778 |
| 2001/0012650 A1* | 8/2001 | Kim et al. | 438/155 |
| 2003/0148565 A1* | 8/2003 | Yamanaka | 438/200 |
| 2004/0121085 A1 | 6/2004 | Wang | |
| 2004/0194706 A1 | 10/2004 | Wang | |
| 2005/0020021 A1* | 1/2005 | Fujiwara et al. | 438/303 |
| 2005/0106896 A1* | 5/2005 | Fukuchi | 438/778 |
| 2005/0145897 A1* | 7/2005 | Matsuo et al. | 257/288 |

FOREIGN PATENT DOCUMENTS

| | | |
|---|---|---|
| JP | 04-365379 | 12/1992 |
| WO | WO 2004/057653 A | 7/2004 |
| WO | WO 2004/059707 A | 7/2004 |

OTHER PUBLICATIONS

Matsumura, et al. "Low-Temperature Chemical-Vapor Deposition of Amorphous Semiconductors and Insulators", Mat. Res. Soc. Symp. Proc. vol. 297 (1993) pp. 109-120.

Yamaguchi, et al. "The Effect of Hydrogen Plasma on the Properties of a-Si: H/a-Si$_{1-x}$N$_x$: H Superlattices" Philosophical Magazine Letters, vol. 58, No. 4 (1988) pp. 213-218.

Thomas Reif, Doctoral Dissertation, University of Cologne (2001), no page numbers.

Tanaka, et al. "Film Properties of Low-K Nitride Films Formed by Hexachlorodisilane and Ammonia", J. Electrochemical Soc., vol. 147 (2000) pp. 2284-2289.

Ishihara, et al. "Low Temperature CVD of SiN Using a New Source Gas (Hydrogen Azide)" Journal of Applied Physics, vol. 31 (1992) Part 2 pp. L74-L77.

Ishihara, et al. "Low Temperature CVD of SiN from Tetra-Silane and Hydrogen Azide" Material Research Society Symposium, vol. 284 (1993) pp. 3-8.

Yeh, et al. "Low Temperature CVD of SiN Film from Hexachloro-Disilane and Hydrazine" Journal of Applied Physics, vol. 35 (1996) pp. 1509-1511.

Yoshioka, et al. "Deposition of Silicon Nitride Films by Silane-Hydrazine Process" J. Electrochemical Society, vol. 114 (1967) pp. 962-964.

Laxman, et al. "A Low Temperature Solution for Silicn Nitride Deposition" Solid State Technology, vol. 43 (2000) pp. 79, 80, 82 and 87.

Gordon, et al. "Silicon Dimethylamido Complexes and Ammonia as Precursors for Atmospheric Pressure CVD of SiN Thin Films" Chem. Mater. vol. 2 (1990) pp. 480-482.

Levy, et al. "LPCVD of SiN Using the Environmentally Benigh Precursor Tris(dimethylamino)silane" P. Electrochemical Society, vol. 96-5 (1996) pp. 239-247.

Yacoubi, et al. "Analysis and Modeling of Low Pressure CVD of Silicon Nitride from a Silane-Ammonia Mixture" J. Electrochemical Society, vol. 146 (1999) pp. 3009-3017.

Stuger, et al. "Aminochlorodisilanes as Precursors to Multifunctionalized Disilane Derivative" J. Organometallic Chem. vol. 547 (1997) pp. 227.

Tamao, et al. "Coupling of (Amino)alkylchlorosilanes with Lithium: New Access to Symmetrical Di- and Tetrafunctional Alkyldisilanes" Organomettalics, vol. 12 (1993) pp. 580-582.

Huber, et al. "Hexa(amino)disilanes With Saturated Cyclic Amino Ligands" Chemical Monthly, vol. 130 (1999) pp. 133-138.

Schuh, et al. "Disilany-amines—Compounds Comprising the Structural Unit Si-Si-N, as Single Source Precursors for PECVD of SiN" Zeitschrift for Anorganische und Allgemeine Chemie, vol. 619 (1993) pp. 1347-1352.

Wheeler, et al. "Aminodisilanes as Silylating Agents for Dry-Developed Positive-Tone Resists for Deep Ultraviolet (248nm) and Extreme Ultraviolet (13.5) Microlithography" Proceedings of the SPIE, vol. 2438 (1995) pp. 762-774.

Kitoh, et al. "Formation of SiN Films by PECVD Using [(CH$_3$)$_2$N]$_3$SiN$_3$" Journal of Applied Physics, vol. 33 (1994) pp. 7076-7079.

Smirnova, et al. "SiCN Films as New Materials Obtained by PCVD from Novel Precursor" Proceedings of SPIE, vol. 4467 (2001) pp. 366-376.

Klingebiel, et al. "Cyclization and Isomerization Reactions in Silylhydrazine Chemistry" Chemical Monthly, vol. 32 (2001) pp. 1105.

PCT International Search Report for PCT/US04/014999, dated Jun. 24, 2005 (AMAT/7785.PC.03).

* cited by examiner

METHOD FOR FORMING A HIGH QUALITY LOW TEMPERATURE SILICON NITRIDE FILM

BACKGROUND OF THE INVENTION

1. Field of the Invention

The present invention relates to the field of thin film formation and more particularly to a method and apparatus for forming silicon nitride films at low deposition temperatures and high deposition rates.

2. Discussion of Related Art

Modern integrated circuits are made up of literally millions and millions of transistors integrated together into functional circuits. In order to further increase the computational power or storage capability of integrated circuits, transistor feature size such as gate length and gate oxide thickness must be further scaled down. Unfortunately, as transistor gate lengths are continually scaled, the transistors electrical characteristics and performance can greatly change due to thermal redistribution of dopants in the device. As such, as devices are further scaled, the thermal budget used to manufacture the integrated circuit must also be reduced to insure consistent and reliable electrical performance of the device. That is, as device dimensions continue to shrink, the deposition and process temperatures used to form the thin films of the integrated circuit must also be reduced. The manufacture of integrated circuits having transistor dimensions of 65 nanometer technology and below are expected to require high quality thin films which can be formed at deposition temperatures of less than 550° C.

Additionally, in order to further scale the semiconductor device, the thin films used to make the devices must be able to be formed with high compositional and thickness uniformity. In order to form films with extremely uniform thickness and composition the films generally need to be formed in single wafer deposition reactors. In order to form thin films in a single wafer reactor in a manufacturable amount of time their deposition rate should be at least 50 Å per minute.

Silicon nitride thin films deposited by thermal chemical vapor deposition (CVD) are used throughout the semiconductor fabrication processes. For example, thermal CVD silicon nitride films are used as spacer films, etch stops, as well as capacitor and interpoly dielectrics. Unfortunately, present techniques of forming high quality silicon nitride films in a single wafer reactor utilizing thermal chemical vapor deposition require high deposition temperatures of greater than 750° C. and/or have low deposition rates at lower temperatures. In most silicon nitride deposition processes, if the deposition temperature is decreased to less than 550° C. the deposition rate is greatly reduced and can go to zero. Additionally, when silicon nitride films are deposited at low temperatures or at high deposition rate the quality of the film is generally poor.

Thus, what is needed is a method of forming a high quality silicon nitride film by thermal chemical vapor deposition (CVD) at low deposition temperature, less than or equal to 550° C. and at a manufacturable deposition rate of greater than 50 Å per minute.

SUMMARY OF THE INVENTION

A method of forming a silicon nitride film is described. According to the present invention, a silicon nitride film is deposited by thermally decomposing a silicon/nitrogen containing source gas or a silicon containing source gas and a nitrogen containing source gas at low deposition temperatures (e.g., less than 550° C.) to form a silicon nitride film. The thermally deposited silicon nitride film is then treated with hydrogen radicals to form a treated silicon nitride film.

DETAILED DESCRIPTION OF THE PRESENT INVENTION

Figure 1:
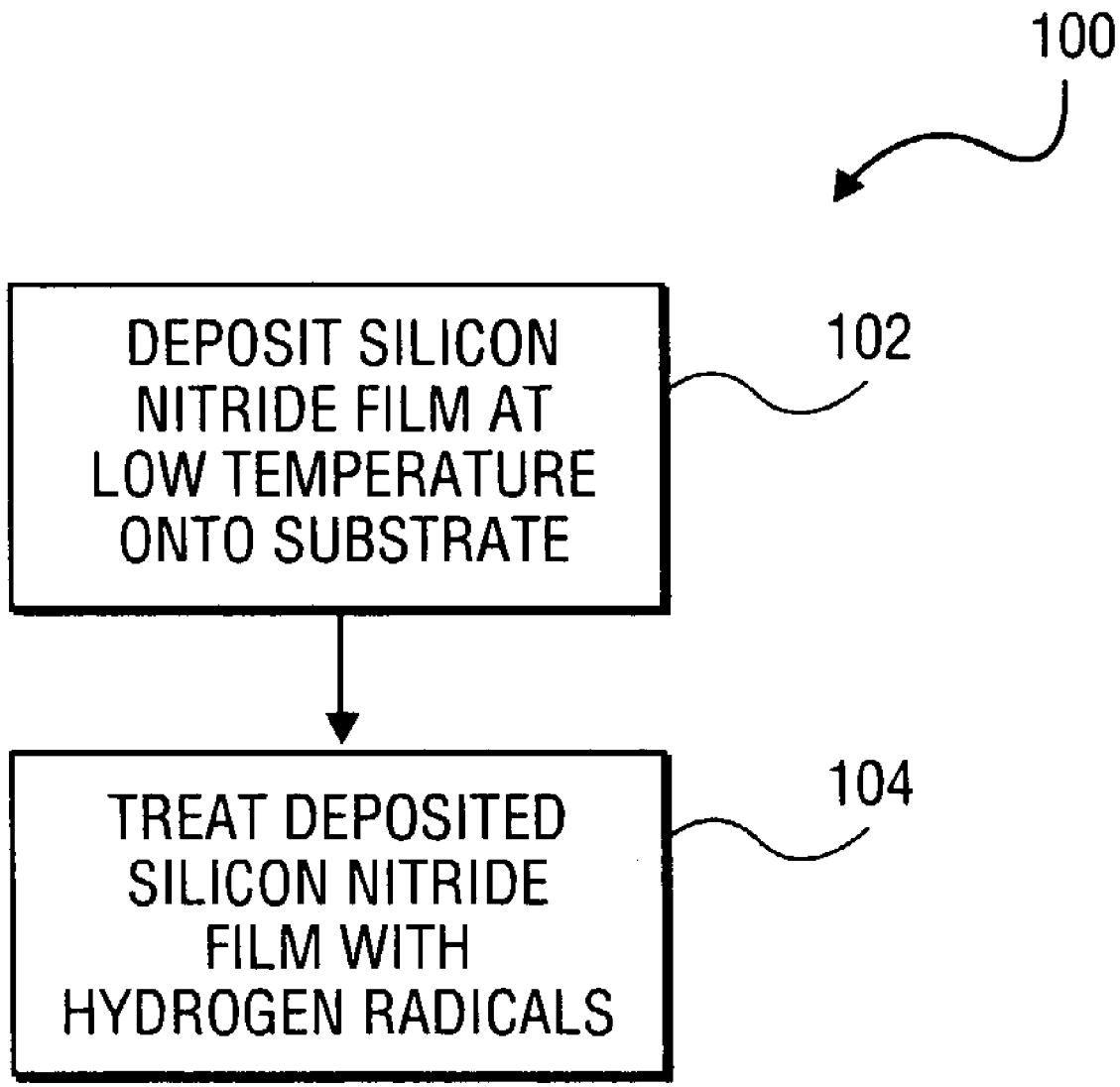
FIG. 1 is an illustration of a flowchart setting forth a method of forming a silicon nitride film in accordance with the present invention.

The present invention is a high quality silicon nitride film which can be formed at a low deposition temperature. In the following description numerous specific details, such as deposition and anneal equipment have been set forth in order to provide a thorough understanding of the present invention. However, one of ordinary skill in the art will realize that the invention may be practiced without these specific details. In other instances well known semiconductor processes have not been described in particular detail so as to avoid unnecessarily obscuring the present invention.

The present invention is a novel method and apparatus for forming a high quality silicon nitride film at a low deposition temperature of less than 550° C. by thermal chemical vapor deposition (CVD). An example of a method of depositing a silicon nitride film is generally illustrated in the flow chart of FIG. 1. According to the first step of the present invention, as set forth in block 102 of FIG. 1, a process gas mix comprising a silicon/nitrogen containing source gas or a silicon containing source gas and a nitrogen containing source gas, is thermally decomposed in a chamber at a deposition temperature (substrate temperature) of less than or equal to 550° C. and ideally less than 500° C. to produce silicon species and nitrogen species from which a silicon nitride film is deposited. The source gas or gases are chosen to enable a silicon nitride film to be formed by thermal chemical vapor deposition at a deposition rate of at least 50 Å per minute and ideally at least 100 Å per minute at low deposition temperatures (i.e., substrate or wafer temperature) of less than or equal to 550° C.

A silicon containing source gas or a silicon/nitrogen containing source gas which can be used to produce a silicon nitride film by thermal chemical vapor deposition at sufficiently high deposition rates at a low temperatures includes, for example, hexachlorodisilane (HCD or $Si_2Cl_6$) and organo silicon containing gases, such as 1,2 diethyl-tetrakis (diethylamino) disilane, 1,2-dichloro-tetrakis (diethylamino) disilane, hexakis (N-pyrrolidino) disilane, and other chlorinated or non-chlorinated alkyl-amino-di or monosilane $R_2N—Si(R'_2)—Si_x(R'_2)_y—NR_2$ (x=y=0 or 1;

R,R'=any combination of ethyl, or iso-propyl, or other alkyl groups, or another alkylamino group, or cyclic group containing N, or a silyl group).

The silicon source gas (precursor) or the silicon/nitrogen source gas (precursor) used to form a silicon nitride film at low temperatures in accordance with the present invention has a weak silicon to silicon single bond (i.e., Si—Si single bond) to enable the molecule to easily decompose at low temperature. Additionally, the silicon source gas or the silicon/nitrogen source gas also ideally has a chlorine (Cl) atom and/or a nitrogen (N) atom bonded to each of the silicon atoms having a weak single bond. That is, the silicon source gas or the silicon/nitrogen source gas ideally has a Si—Cl functional group and/or a Si—N functional group continuous to the weak Si—Si single bond. This is critical to improved step coverage and microloading specially for ever decreasing temperatures at suitable deposition rates. In embodiments of the present invention, the silicon source gas or the silicon/nitrogen source gas has weak silicon to silicon single bond wherein the other three bonds of each of the silicon atoms are bonded to either a nitrogen (N) atom or a chlorine (Cl) atom and ideally are bonded to a nitrogen atom and a chlorine atom. In embodiments of the present invention, the silicon source gas or the silicon/nitrogen source gas includes organo groups where an organo group is ideally bonded to a nitrogen atom which is bonded to a silicon atom having a single bond with another silicon atom. Alternatively, an organo group can be bonded directly to a silicon atom having a weak single bond with another silicon atom. The silicon source gas or the silicon/nitrogen source gas are ideally symmetrical molecules.

A nitrogen source gas or precursor which can be used to deposit a silicon and nitrogen containing film at low temperatures in accordance with the present invention includes but is not limited to ammonia ($NH_3$) or $N_2H_4$. The nitrogen source gas ideally contains a weak nitrogen-nitrogen single bond (i.e., N—N single bond) to enable easy decomposition of the nitrogen source gas at low temperature. Additionally, when a silicon/nitrogen containing source gas is used in the process gas mix, some amount of a nitrogen source gas will typically also be included in the gas mix for flexible control over the composition of the deposited film during the film deposition.

Because the silicon nitride film is deposited at a low temperature and high deposition rate, the silicon nitride film is typically initially of poor quality film. That is, the initial "as deposited" silicon nitride film can have, for example, a high total hydrogen concentration (e.g., greater than 15 atomic percent) with Si—H form of significant fraction, a high carbon concentration (e.g., greater than 10 atomic percent) if an organic silicon precursor is used, a high chlorine concentration (e.g., greater than 1 atomic percent) if a chlorinated silicon precursor is used, a low refractive index (e.g., less than 1.85) and a high wet etch rate (e.g., more than two times the etch rate of silicon oxide utilizing an oxide etch, such as a buffered oxide etch (BOE)).

In order to improve the quality of the as deposited silicon nitride film as set forth in block 104 of FIG. 1, the film is treated with hydrogen radicals for a predetermined period of time in order to improve the quality of the film (e.g., reduce the total hydrogen concentration to less than 10 atomic percent or reduce the fraction of Si—H forms or reduce the carbon concentrations to for example less than five atomic percent or reduce the chlorine concentration to for example less than one atomic percent or increase the refractive index to for example greater than 1.90, or decrease the wet etch rate to for example approximately the same (1:1) etch rate of silicon oxide utilizing an oxide etch, such as BOE). The hydrogen radicals can be formed by, for example, plasma decomposition (either insitu or remote) or a "hotwire" decomposition of a hydrogen containing gas, such as ammonia ($NH_3$) and hydrogen ($H_2$). The as deposited silicon nitride film can be treated with hydrogen radicals at a flux between $5 \times 10^{15}$ atomic/cm$^2$–$1 \times 10^{17}$ atoms/cm$^2$. During the hydrogen radical treatment the substrate is heated to a low temperature of between 450–600° C. A sufficient treatment can typically occur within 15–120 seconds. The process of the present invention enables a high quality silicon nitride film to be formed by thermal chemical vapor deposition at a low deposition temperature and at a manfacturably high deposition rate (e.g., greater than 50 Å/min). The low deposition temperature enables the silicon nitride film to be used in semiconductor circuit manufacturing processes at application or locations after transistor or active device formation because the deposition temperature is sufficiently low not to dramatically affect the thermal budget of the device or alter dopant distribution therein. The high deposition rate of the silicon nitride film enables the process to be implemented in a single wafer reactor.

Figure 2:
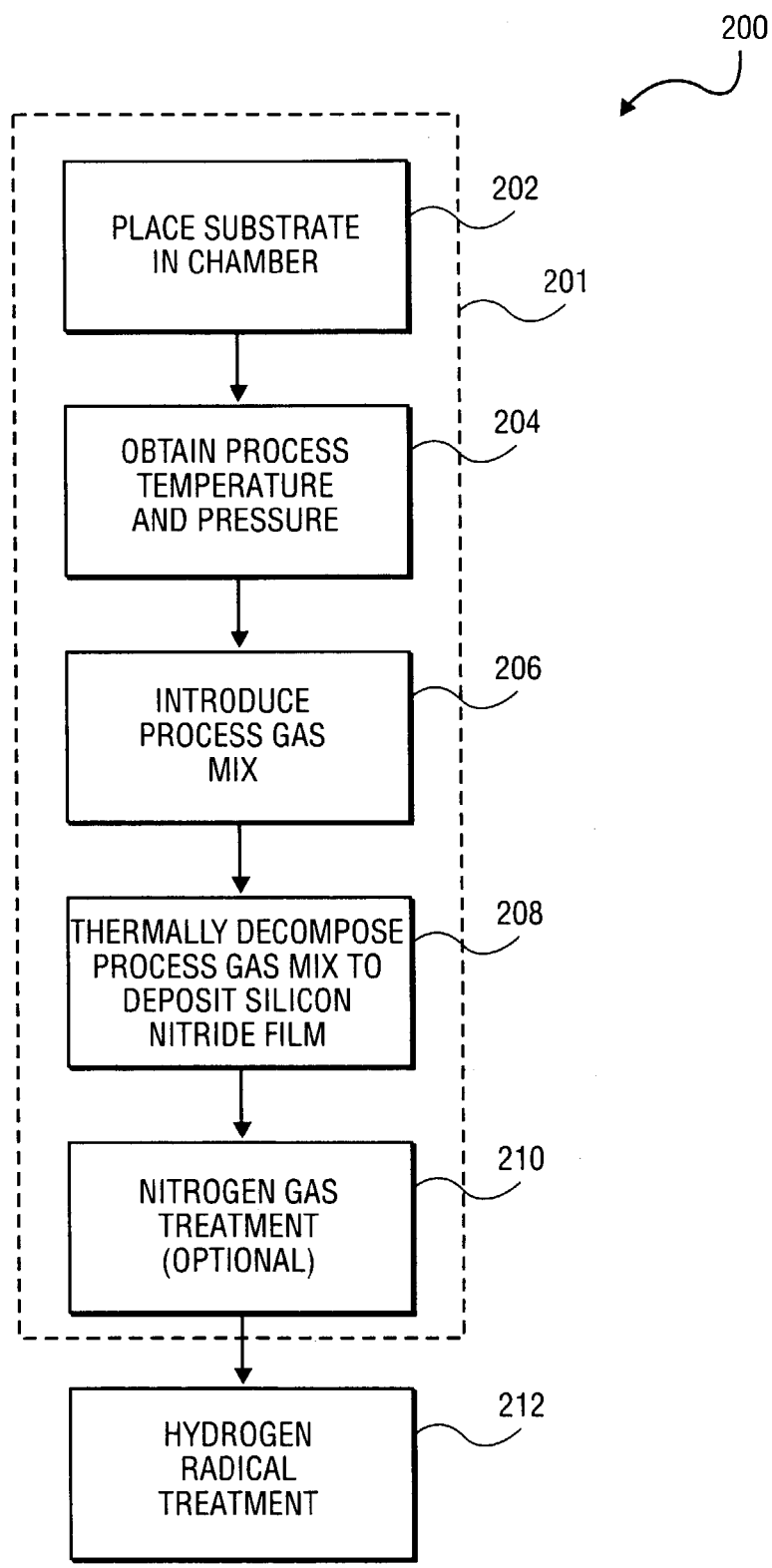
FIG. 2 is an illustration of a flowchart depicting a method of forming a silicon nitride film in accordance with an embodiment of the present invention.

An example of a method of depositing and treating a silicon nitride film in a single wafer reactor in accordance with an embodiment of the present invention is illustrated in flow chart 200 of FIG. 2. The first step is to deposit a silicon nitride film by thermal chemical vapor deposition onto a wafer or substrate. A specific example of the silicon nitride deposition process is set forth in FIG. 2 as block 201 of flowchart 200 and can comprise steps 202–210 of flow chart 200. The first step in depositing a silicon nitride film is to place the wafer or substrate into a chamber. Ideally the silicon nitride film is formed in a chamber of a reduced pressure single wafer cold wall reactor having a resistively heated substrate support for heating the wafer, such as the Applied Materials, Xgen Chamber. An example of a suitable chamber is shown and illustrated in FIG. 4.

Once the substrate has been placed into the chamber, the deposition pressure and temperature used to deposit the silicon nitride film is achieved. In an embodiment of the present invention, the deposition pressure at which the deposition of silicon nitride film occurs is between 10–350 torr. The deposition temperature (i.e., the temperature of the wafer or substrate) will depend upon the specific process gases (e.g., silicon containing source gas and nitrogen containing source gas) used to deposit the silicon nitride film. The wafer or substrate temperature is less than or equal to 550° C. and ideally less than 500° C. and generally between 550–450° C. during the deposition process. Next, as set forth in block 206, the process gases are introduced into the deposition chamber. The process gas mix will include at least a silicon containing source gas (i.e., gas which can be decomposed to provide silicon atoms or silicon containing intermediate species for the deposition of the silicon nitride film) and the nitrogen containing source gas (i.e., a gas which can be thermally decomposed to provide a source of nitrogen atoms or nitrogen containing species for the deposition of a silicon nitride film). Alternatively, the process gas mix may include a silicon/nitrogen source gas which provides from a single molecule a source of both nitrogen and silicon atoms or nitrogen and silicon bearing intermediate species for the formation of silicon nitride film. When a silicon/nitrogen source gas is utilized, the process gas mix may also include a nitrogen source gas and/or a silicon source gas or may include just the silicon/nitrogen source gas without additional sources of nitrogen and silicon.

The nitrogen containing source gas can include but is not limited to ammonia ($NH_3$) and hydrazine ($N_2H_4$). In an embodiment of the present invention, the nitrogen source gas is provided into the deposition chamber prior to providing the silicon source gas into the chamber. Additionally, in an embodiment of the present invention, the nitrogen source gas has a weak nitrogen to nitrogen single bond (i.e., N—N single bond).

The silicon source gas (precursor) or the silicon/nitrogen source gas (precursor) used to form a silicon nitride film at low temperatures in accordance with the present invention has a weak silicon to silicon single bond (i.e., Si—Si single bond) to enable the molecule to easily decompose at low temperature. Additionally, the silicon source gas or the silicon/nitrogen source gas also ideally has a chlorine (Cl) atom and/or a nitrogen (N) atom bonded to each of the silicon atoms having a weak single bond. That is, the silicon source gas or the silicon/nitrogen source gas ideally has a Si—Cl functional group and/or a Si—N functional group continuous to the weak Si—Si single bond. This is critical to improved step coverage and microloading specially for ever decreasing temperatures at suitable deposition rates. In embodiments of the present invention, the silicon source gas or the silicon/nitrogen source gas has weak silicon to silicon single bond wherein the other three bonds of each of the silicon atoms are bonded to either a nitrogen (N) atom or a chlorine (Cl) atom and ideally are bonded to a nitrogen atom and a chlorine atom. In embodiments of the present invention, the silicon source gas or the silicon/nitrogen source gas includes organo groups where an organo group is ideally bonded to a nitrogen atom which is bonded to a silicon atom having a single bond with another silicon atom. Alternatively, an organo group can be bonded directly to a silicon atom having a weak single bond with another silicon atom. The silicon source gas or the silicon/nitrogen source gas are ideally symmetrical molecules.

In an embodiment of the present invention, the silicon source gas is hexachlorodisilane (HCD). A silicon nitride film can be formed by providing HCD and $NH_3$ or $N_2H_4$ into the chamber. If HCD is utilized it may be mixed with an inert carrier gas, such as $N_2$, prior to being introduced into the reaction chamber. It is to be appreciated that a carrier gas, such as $N_2$ is not reacted or does not thermally decompose at the deposition temperature of the reaction and as such does not participate in the reaction. In an embodiment of the present invention, HCD is provided into the reaction chamber at a rate between 10–200 sccm while between 500–5000 sccm of nitrogen source gases provided. In one example, the HCD source gas and the nitrogen source gas have a flow rate of 1:1 and 1:1000 and ideally between 1:1 and 1:500 respectively. Such a process can form a silicon nitride film at a deposition rate of approximately 80 Å/min at a wafer temperature of 530° C. and at a deposition rate of approximately 50 Å/min at a wafer temperature of 480° C.

In embodiment of the present invention, the silicon containing source gas is an organic silicon containing gas, such as 1,2 diethyl-tetrakis (diethylamino) disilane, 1,2-dichloro-tetrakis (diethylamino) disilane, hexakis (N-pyrrolidino) disilane, and other chlorinated or non-chlorinated alkyl-amino-di or mono-silane $R_2N$—$Si(R'_2)$—$Si_x(R'_2)_y$—$NR_2$ (x=y=0 or 1; R,R'=any combination of Cl, or methyl, or ethyl, or iso-propyl, or other alkyl groups, or another alkylamino group, or cyclic group containing N, or a silyl group). A suitable silicon nitride film can be formed utilizing 1,2-dichloro-tetrakis (diethylamino) disilane a flow rate of 10–100 sccm and a nitrogen source gas at a flow rate between 200 –2000 sccm. A suitable silicon nitride film can be deposited from 1,2-diethrl-tetrakis (diethylamino) disilane at a flow rate between 10–100 sccm and a nitrogen source gas at a flow rate between 200–2000 sccm. Such a process can form a silicon nitride film at a deposition rate of about 80 Å/min at 530° C. wafer temperature and at a deposition rate of about 50 Å/min at 480° C. wafer temperature.

Next, as set forth in block 208 of flow chart 200, heat from the heated substrate or substrate support causes the silicon/nitrogen source gas or the silicon source gas and the nitrogen source gas to thermally decompose. The thermal decomposition of the silicon source gas provides silicon atoms or silicon containing intermediate species. The thermal decomposition of the nitrogen source gas provides nitrogen atoms or nitrogen containing intermediate species. The thermal decomposition of a silicon/nitrogen source gas can provide both silicon atoms or silicon intermediate species as well as nitrogen atoms or nitrogen intermediate species. The silicon atoms or silicon containing intermediate species react with the nitrogen atoms or nitrogen containing intermediate species to deposit a silicon nitride film over the surface of the substrate. It is to be appreciated that in the present invention, the silicon/nitrogen containing source gas or the silicon source gas and the nitrogen source gas are thermally decomposed using only thermal energy, such as heat from the substrate or heat from the substrate support without the aid of additional sources of energy, such as photon enhancement or plasma enhancement. In an embodiment of the present invention, the silicon nitride film is deposited to a thickness between 10–150 Å with a thickness of less than 120 Å and ideally less than 80 Å being preferred. If thicker films are desired, multiple deposition/hydrogen radicals treatment cycles can be used to deposit thicker films as will be discussed later.

In an embodiment of the present invention, as set forth in block 210, after deposition of a sufficiently thick silicon nitride film, the flow of the silicon source gas and nitrogen source gas is stopped. In an embodiment of the present invention, when the deposition of the silicon nitride is completed, the substrate can be optionally treated with the nitrogen source gas as set forth in block 210. Only the nitrogen source gas is introduced in the reaction chamber for about 10 seconds. Treating the silicon nitride film with a nitrogen source gas at the end of the deposition step terminates unreacted silicon sites on the substrate. This operation helps increase the N/Si ratio and reduce hydrogen (specifically in the Si—H bond form) in the silicon nitride film. However, operation 210 is not necessary to achieve good silicon nitride films in accordance with the present invention.

The process gas mix utilized in the present invention to deposit the silicon nitride film enables a silicon nitride film to be deposited by thermal chemical vapor deposition at a rate of at least 50 Å per minute and ideally at a rate greater than 100 Å per minute at low deposition temperature of less than 550° C. and ideally less than 500° C.

Because the silicon nitride film is deposited at a high deposition rate and/or at a low deposition temperature, the "as deposited" silicon nitride film tends to be of poor quality. That is, the "as deposited" silicon nitride film tends to have a high hydrogen concentration of greater than 15 atomic percent significantly in Si—H forms and a low refractive index of less than 1.85 and a high wet etch rate (e.g., more than two times the etch rate of silicon oxide utilizing an oxide etch, such as buffered oxide etch (BOE)). Additionally, when a chlorinated and/or an organo silicon precursor is utilized, the film can also have a high chlorine and carbon concentration of greater than 1.0 and 10 atomic percent respectively. Such a poor quality silicon nitride film is unsuitable for many applications of silicon nitride films in semiconductor device fabrication, such as spacers and inter-poly dielectrics.

According to the present invention, the "as deposited" silicon nitride film is treated with hydrogen radicals for a predetermined period of time to improve quality of the "as deposited" film as set forth in block 212 of flow chart 200. In an embodiment of the present invention, the silicon nitride film is exposed to hydrogen radicals at a flux between $5 \times 10^{15}$ atom/cm$^2$–$1 \times 10^{17}$ atoms/cm$^2$ and ideally at approximately $1 \times 10^{16}$ atoms/cm$^2$. In embodiment of the present invention, the silicon nitride film is treated with hydrogen radicals for between 15–120 seconds while heating the substrate to a temperature between 450–600° C. The hydrogen radical treatment can occur at a pressure between 100 militorr to 5 torr.

The hydrogen radicals used for the hydrogen radical treatment can be produced in any suitable manner. In embodiment of the present invention, the hydrogen radicals are formed by plasma decomposition of a hydrogen containing gas which can be decomposed to provide a sufficient number of hydrogen radicals. Hydrogen radicals include all species of atomic hydrogen including highly activated neutral atomic hydrogen, and charged hydrogen ions. A suitable hydrogen source gas includes ammonia (NH$_3$) and hydrogen gas (H$_2$). In embodiment of the present invention, the hydrogen source gas includes a mixture of NH$_3$ and H$_2$. In an embodiment of the present invention, the hydrogen treatment gas includes only NH$_3$ or only H$_2$. Additionally, in an embodiment of the present invention, an inert gas, such as N$_2$, Ar or He can be provided along with the hydrogen treatment gas. A hydrogen containing gas can be suitably disassociated to provide hydrogen radicals utilizing a microwave or radio-frequency source at a power between 200–2000 watts. The plasma decomposition of a hydrogen treatment gas can be accomplished in-situ or utilizing a remote plasma. In an in-situ process, the plasma and hydrogen radicals are generated in the same chamber in which the substrate having the silicon nitride film to be treated is located. An example of a suitable plasma chamber includes a capacitively-coupled PECVD or a high density plasma HDP chamber. In a remote plasma treatment, the hydrogen radicals and plasma are generated with microwaves in a chamber separated from the chamber in which the substrate having a silicon nitride film to be treated as located. In a remote plasma process, the plasma and hydrogen radicals are generated in a first chamber (dissociation chamber or cavity) and then they flow through a conduit from the dissociation chamber and into a second chamber containing a substrate with a silicon nitride film to be treated. Any suitable remote plasma generator reactor can be used, such as but not limited to an Astex Astron, the Applied Materials Remote Plasma Nitridation RPN source, and the Applied Materials Advanced Strip Passivation Plus (ASP) Chamber.

In an embodiment of the present invention, the hydrogen radicals are formed by a "hot wire" or catalytic decomposition of a hydrogen containing gas, such as ammonia (NH$_3$) and hydrogen gas (H$_2$) or combinations thereof. In a "hot wire" process, a wire or catalyst, such as a tungsten filament is heated to a high temperature of approximately 1600–1800° C. and the hydrogen treatment gas fed over the filament. The heated filament causes the cracking or decomposition of the hydrogen treatment gas to form the hydrogen radicals. The hydrogen radicals then treat a silicon nitride film formed on a substrate located beneath filament. Although the filament has a high temperature, the substrate is still heated only to a low temperature of less than 600° C. and preferably to less than 550° C. during the treatment process. In yet another embodiment of the present invention, an inductive generated plasma may be utilized to generate the hydrogen radicals.

In an embodiment of the present invention, the "as deposited" silicon nitride film is exposed to hydrogen radicals for a period of time and temperature and pressure to reduce the hydrogen concentration of the film to less than 10 atomic percent and/or to reduce the fraction of Si—H bonds as well as to increase the index of refractions to greater than 1.9. If an organo silicon source gas is utilized the film can be treated until the carbon concentration in the film drops below five atomic percent. If a chlorinated silicon source gas is utilized the film can be treated until the chlorine concentration in the film drops below one atomic percent. In an embodiment of the present invention, the silicon nitride film is treated until the wet etch rate is approximately the same as silicon oxide utilizing a BOE.

Because the distance in which the hydrogen radicals can penetrate the silicon nitride film is limited to generally less than 100 Å and typically less than 50 Å by the low temperature process, a silicon nitride film of no more than 150 Å and preferably no more than 100 Å is formed prior to hydrogen radical treatment. When thicker silicon nitride films are desired, multiple deposition and treatment cycles can be used. For example, if a 300 Å silicon nitride film is desired, first a 100 Å silicon nitride film can be deposited and then the silicon nitride film is treated with hydrogen radical. Next, a second 100 Å silicon nitride film would be deposited on the treated silicon nitride film and then the second silicon nitride film treated with hydrogen radicals. Next, a third 100 Å silicon nitride film would be deposited on the second silicon nitride film and it treated with hydrogen radicals. In this way, a high quality silicon nitride film can be formed to any thickness desired.

The method of forming a silicon nitride film in accordance with the present invention, is ideal for use in the fabrication of semiconductor devices which require a low thermal budget and/or the prevention redistribution of dopants placed in a silicon substrate. One example, for the use of a silicon nitride film in accordance with the present invention, is in the fabrication of sidewall spacer. In such an application, a substrate, such as substrate 300 shown in FIG. 3A would be provided. Substrate 300 includes a monocrystalline silicon substrate or film 302 having a gate dielectric layer 304 formed thereon. A gate electrode 306 having laterally opposite sidewalls is formed on the gate dielectric layer. Typically a pair of source/drain tip or extension regions 310 would be formed into the silicon substrate 302 in alignment with the laterally opposite sidewalls of gate electrode 306.

Figure 3A:
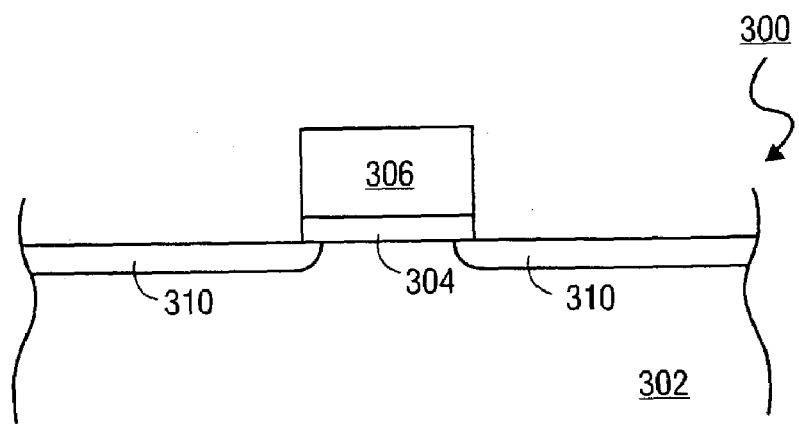
FIGS. 3A–3C are cross-sectional illustrations of a method of forming a semiconductor device having sidewall spacers formed from silicon nitride film in accordance with the present invention.
Figure 3B:
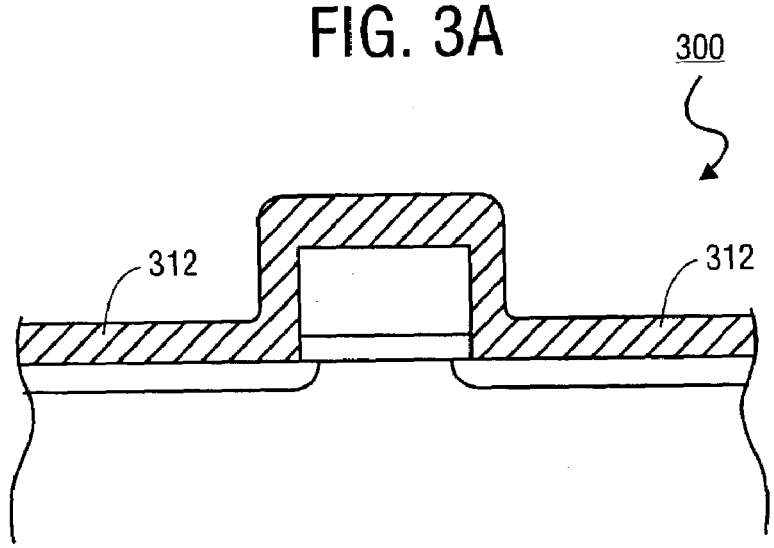

Next, as shown in FIG. 3B a low temperature silicon nitride film is formed accordance with the present invention, would be blanket deposited over the substrate of FIG. 300. The thickness of the silicon nitride film 312 depends upon the physical characteristics of the transistor being fabricated, and for a 65 nm technology device would generally be at least 200 Å thick. According to the present invention, a silicon nitride film would be deposited as described above utilizing a low deposition temperature at a high deposition rate. A silicon nitride layer having thickness of 100 Å or less and ideally less than 50 Å is first formed. The silicon nitride film is then be annealed with hydrogen radicals as described above. Next, if necessary, a second silicon nitride film is formed on the hydrogen radical treated first silicon nitride film. The second silicon nitride film would then be treated with hydrogen radicals as described above. Next, a third silicon nitride layer would be deposited by a low temperature chemical vapor deposition as described above. The third deposited silicon nitride layer is treated with hydrogen radicals as described above. The process is continued in this manner until a silicon nitride film 312 having a total thickness desired is formed. In some uses embodiments, a deposited or grown silicon oxide layer is formed prior to the silicon nitride layer, and therefore underlies the silicon nitride layer. Because the silicon nitride layer 312 is formed with a low temperature process and is treated with hydrogen radicals at a low temperature, the dopants forming the source/drain extensions 310 are not substantially moved or redistribute within substrate 302 during the silicon nitride. In this way, the electrical characteristics of the fabricated device would be consistent.

Figure 3C:
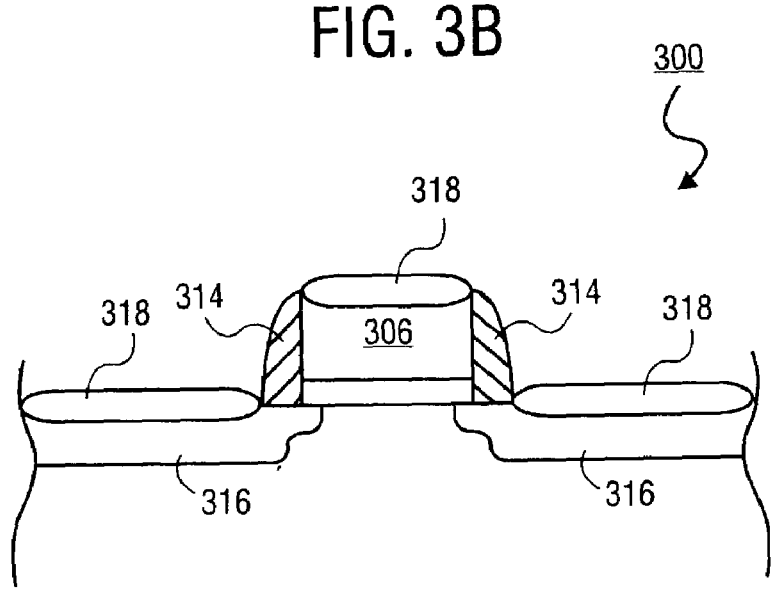

Next, as shown in FIG. 3C, after the formation of a sufficiently thick silicon nitride layer 312, silicon nitride 312 can be anisotropically etched to form sidewall spacers 314 which run along laterally opposite sidewalls of gate electrode 306. The anisotropic etch process removes the silicon nitride layer from horizontal surfaces, such as source/drain extension 310 and the top of gate electrode 306 while leaving silicon nitride on vertical surfaces, such as sidewalls of the gate electrode 306. After formation of the sidewall spacers 314, additional processing of the semiconductor device can occur, such as the formation of deep source/drain regions 316 and/or the formation of silicide 318 on the source/drain regions. Sidewall spacers 314 allow offsettting of the deep source/drain regions and allow silicides, such as titanium silicide or cobalt silicide, to be formed on the source/drain regions and the top of the gate electrode in a self-aligned process as is well known in the art.

Apparatus for Formation of a Low Temperature Silicon Nitride Film

Figure 4:
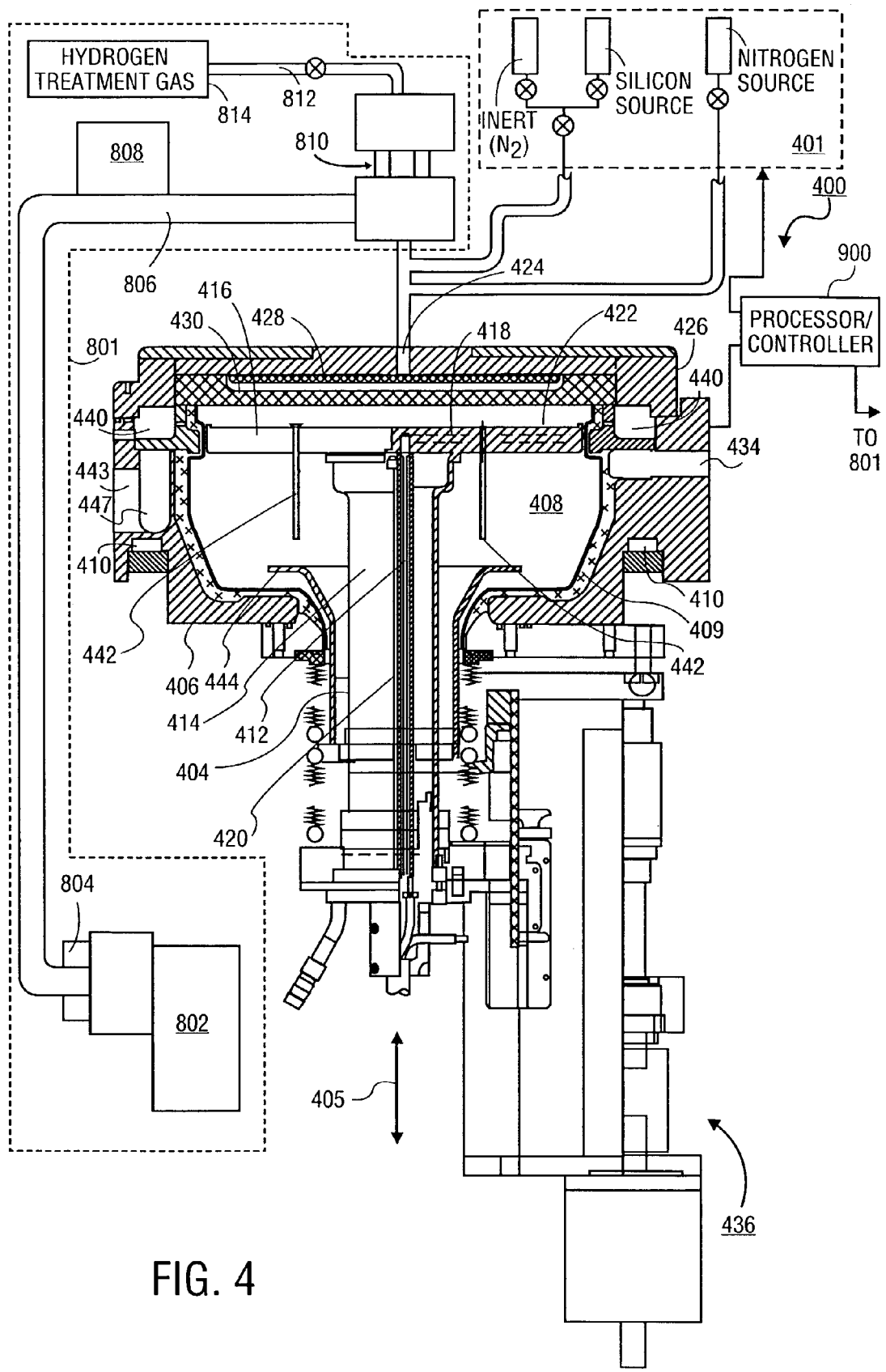
FIG. 4 is an illustration of an apparatus which can be used to form a silicon nitride film in accordance with the present invention.

The silicon nitride film of the present invention is ideally formed in a low pressure thermal chemical vapor deposition reactor. An example of a suitable reactor 400 is illustrated in FIG. 4. In an embodiment of the present invention, the hydrogen radical treatment can occur in the same chamber as used to deposit the silicon nitride film. In order to treat the "as deposited" silicon nitride film with hydrogen radicals in the same chamber used to deposit the film, a remote plasma source can be coupled to a low pressure chemical vapor deposition reactor to provide a source of hydrogen radicals to the chamber. An example of a remote plasma generator source 801 coupled to a low pressure chemical vapor deposition reactor 400 is also illustrated in FIG. 4. Coupling a remote plasma generator 801 to a thermal chemical vapor deposition reactor 400 greatly improves the throughput of the present invention and enables the silicon nitride layer to be directly treated with hydrogen radicals after the silicon nitride deposition. Additionally, such an apparatus dramatically improves wafer throughput when successive deposition/treatment cycles are used to form thick silicon nitride films, such as silicon nitride films greater than 200 Å.

FIG. 4 illustrates a reactor vessel assembly (reactor) 400. FIG. 4 illustrates that the reactor 400 comprises a chamber body 406 that defines a reaction chamber 408 in which process gases, precursor gases, or reactant gases are thermally decomposed to form the silicon comprising film on a wafer substrate (not shown). The chamber body 406 is constructed of materials that will enable the chamber to sustain a pressure between 10 to about 350 Torr. In one exemplary embodiment, the chamber body 406 is constructed of an aluminum alloy material. The chamber body 406 includes passages 410 for a temperature controlled fluid to be pumped therethrough to cool the chamber body 406. Equipped with the temperature controlled fluid passages, the reactor 400 is referred to as a "cold-wall" reactor. Cooling the chamber body 406 prevents corrosion to the material that is used to form the chamber body 406 due to the presence of the reactive species and the high temperature.

Resident in the chamber body 406 are a reaction chamber 408, a chamber lid 426, a faceplate (or shower head) 430, a blocker plate 428, and a resistive heating assembly 404. The resistive heating assembly 404 includes wire leads 412 running the length of a heater tube 414 that is made of nickel. At the end of the heater tube 414 is a heating disk 416 made out of sintered AlN. Within the heating disk 416 is one or more heating coil 418 made out of molybdenum. The wires 412 and the coil 418 are joined by brazing and are electrically conductive therein. The wires 412 are thermally insulated with AlN ceramic sleeves 420. The coil 418 provides most of the electrical resistance and therefore most of the reaction chamber 408 heating. At the end of the heating disk 416 is a recess called a pocket 422 and within the pocket 422 is placed a wafer (not shown).

FIG. 4 illustrates that the chamber body 408 further houses a lifter assembly 436. The lifter assembly 436 facilitates the moving of the wafer substrate (not shown) in and out of the reaction chamber 408. The lifter assembly 436 can be a stepper motor. The lifter assembly 436 moves the heater assembly 404 up and down along an axis 405 to facilitate the moving of the wafer substrate in and out of the reaction chamber 408.

A substrate or wafer is placed into the reaction chamber 408 through the entry port 434 by for example, a robotic transfer mechanism (not shown). In one embodiment, the robotic transfer mechanism couples to a transfer blade and the robotic transfer mechanism controls the transfer blade. The transfer blade inserts the substrate through the opening to load the substrate into the reaction chamber 408 and onto pocket 422 of the heating disk 416. As the substrate is being loaded, the lifter assembly 436 lowers the heater assembly 404 and the heating disk 416 in an inferior direction along the axis 405 so that the surface of the heating disk 416 is below the entry port 434. As the heating disk 416 is lowered, the substrate is placed in the reaction chamber 408. Once the substrate is loaded, the entry 434 is sealed and the lifter assembly 436 moves or advances the heater assembly 404 and the heating disk 416 in a superior (e.g., upward) direction toward the faceplate 430. In one exemplary embodiment, the advancement stops when the wafer substrate is a short distance (e.g., 400–900 mils) from the faceplate 430.

In one exemplary embodiment, when ready for deposition or processing, process gases or precursor gases controlled by a gas panel 401 are introduced into the reaction chamber 408. The blocker plate 428 has a plurality of holes (not shown) to accommodate a gas flow therethrough. The process gas is introduced into the reaction chamber 408 first through the port 424, through the blocker plate 428, and then through the faceplate 430. The process gas is distributed from the port 424 through the plurality of holes in the blocker plate 428 and then through the faceplate 430. The faceplate 430 uniformly distributes the process gas into the reaction chamber 408.

The substrate can be removed from the chamber by for example inferiorly (lowering) the heater assembly 404. As the heating assembly 404 moves in an inferior direction, through the action of the lifter assembly 436, the lift pins 442, contact the contact lift plate 444 and remain stationary and ultimately, extend above the top surface of the heating disk 416 to separate the substrate from the heating disk 416 as it is lowered. A transfer blade is then inserted through opening 434 and is positioned between the substrate and the heating disk 416. The contact lift plate 444 is then lowered, thereby lowering the lift pins 442 and causing the substrate to be lowered onto the transfer blade. The substrate can then be removed through the entry port 434 by the transfer blade.

The mechanism described above may be repeated for subsequent substrates. A detailed description of one suitable lifter assembly 436 is described in U.S. Pat. No. 5,772,773, which is assigned to Applied Materials, Inc. of Santa Clara, Calif.

The reactor 400 also includes a temperature indicator (not shown) to monitor the processing temperature inside the reaction chamber 408. In one example, the temperature indicator can be a thermocouple, which is positioned such that it conveniently provides data about the temperature at the surface of the heating disk 416 (or at the surface of a substrate supported by the heating disk 416). In reactor 400 the temperature of a substrate is slightly cooler, 20–30° C. than the temperature of the heating disk 416.

FIG. 4 further illustrate that the reaction chamber 408 is lined with a temperature-controlled liner or an insulation liner 409. As mentioned above, the chamber body 406 includes the passages 410 for a temperature controlled fluid to create the cold-wall chamber effect. The reaction temperature inside reaction chamber 408 can be as high as 600° C. or even more. With the chemistry that is used to form the film in the reaction chamber 408, high temperature will easily corrode the chamber body 406 of the reaction chamber 408. Hence, the chamber body 406 is equipped with the passages 410 for a temperature controlled fluid such as water or other coolant fluid that will cool the chamber body 406. This will prevent the chamber body 406 from getting too hot which will cause the chamber body 406 to be easily corroded. One problem that may associate with such a cold-wall chamber is that the areas inside the reaction chamber 408 that are in close proximity with the chamber's cold-wall tend to experience a sharp drop in temperature. The sharp drop in temperature in these areas encourages formation or condensation of particles that are undesirable or unfavorable for the silicon comprising films formed in the reaction chamber 408. For example, the reaction of HCD and $NH_3$ in a deposition process to form a silicon nitride ($Si_3N_4$) film typically causes the formation of $NH_4Cl$. $NH_4Cl$ is an undesirable salt by-product that requires cleaning to prevent contamination to the $Si_3N_4$ being formed. When the temperature drops below about 150° C., condensation such as $NH_4Cl$ will occur. These particles may become dislodged from the chamber wall. The dislodged particles form nucleation sites for particle formations on the wafer substrates. In one embodiment, the reaction chamber 408 is lined with the temperature-controlled line 409 to prevent the undesirable condensation of particles.

In one embodiment, the temperature-controlled liner 409 is coupled to the wall of the chamber body 406 such that the temperature-controlled liner 409 only has a few physical contacting points along the wall of the chamber body 406. (See for example, contacting points 459 illustrated in FIG. 4). Minimizing the physical contacts between the temperature-controlled liner 409 and the wall of the chamber body 406 minimizes heat loss to the chamber body 406 by minimizing conducting points.

A purge gas (e.g., nitrogen) can be fed into the bottom of the reaction chamber 408 during deposition to prevent unwanted deposition.

The reactor 400 also couples to a pressure regulator or regulators (not shown). The pressure regulators establish and maintain pressure in the reaction chamber 408. Such pressure regulators are known in the field. The pressure regulator(s) that can be used for the exemplary embodiments must be able to maintain pressure at a level in the range of about 10 Torr to about 350 Torr. Alternatively, the reactor 400 may also be coupled to a gas pump-out system (not shown), which is well-known in the field to pump gases out of the reaction chamber 408. The gas pump-out system (which may include for example, throttle valve(s)) can also be used to control the pressure in the reaction chamber 408. The reactor 400 also couples to sensors (not shown), which monitor the processing pressure within the reaction chamber 408.

In one embodiment, a controller or processor/controller 900 is coupled to the chamber body 406 to receive signals from the sensors, which indicate the chamber pressure. The processor/controller 900 can also be coupled to the gas panel 401 system to control the flow of the nitrogen source gas, the silicon source gas, and inert and/or purge gas. The processor 900 can work in conjunction with the pressure regulator or regulators to adjust or to maintain the desired pressure within the reaction chamber 408. Additionally, process/controller can control the temperature of the heating disk, and therefore the temperature of a substrate placed thereon. Processor/controller 900 includes a memory which contains instructions in a computer readable format for controlling the nitrogen source gas flow, the silicon source gas flow and the inert gas flow, as well as the pressure in the chamber and temperature of the heating disk within parameters set forth above in order to form a silicon nitride film in accordance with the present invention. For example, stored in memory of processor/controller 900 are instructions for heating a substrate to a temperature less than or equal to 550° C. and instructions for providing a silicon source gas, and a nitrogen source gas and/or a silicon/nitrogen source gas into chamber 408 while heating the substrate to a temperature of less than or equal 550° C., as well as instructions for controlling the pressure within chamber 408 to between 10–350 torr.

The materials for components in the reactor 400 are selected such that the exposed components must be compatible with high temperature processing of the present invention. The thermal decomposition of the precursors or the reactant species of the present invention to form the silicon comprising film involves temperature inside the reaction chamber 408 up to as high as 600° C. The materials for the components in the reactor 400 should be of the types that withstand such high temperature. In one embodiment, the chamber body 406 is made out of a corrosion resistant metal such as hard anodized aluminum. Such type of aluminum is often expensive. Alternatively, the chamber body 406 includes the passages 410 for a temperature-controlled fluid to be passed through. The passage of the temperature-controlled fluid enables the chamber body 406 to be made out of a very inexpensive aluminum alloy or other suitable metal since the passages 410 will keep the chamber body 406 cool. As mentioned, this is one of the reasons why the reactor 400 is often referred to as a cold-wall reactor. To prevent unwanted condensation on the cold-wall or the cooled chamber body 406, the temperature-controlled liner 409 described above can be made out a material that will absorbs the heat radiated from the reaction chamber 408 and keeps the temperature of the temperature-controlled liner 409 to at least about or greater than 150° C. or alternatively to at least about of greater than 200° C. depending on the film forming applications. In one embodiment, the temperature-controlled liner 409 needs to be maintained at a temperature that is sufficient to prevent unwanted condensation.

Additionally, the component materials should also be compatible with the process gases and other chemicals, such as cleaning chemicals and the precursors that may be introduced into the reaction chamber 408. In one embodiment, the exposed surfaces of the heating assembly 404 may be comprised of a variety of materials provided that the materials are compatible with the process. For example, the exemplary embodiments in this discussion require corrosive chemistry to be applied at high temperatures. The components of the heating assembly thus must withstand this environment. In one example, the components of the heating assembly are made out of a ceramic material such as aluminum nitride (AlN). The heating disk 416 of the heating assembly 404 may also be comprised of aluminum nitride material.

In one exemplary embodiment, the reaction chamber 408 is stabilized using a stabilization gas such as $N_2$, He, Ar, or combinations thereof. In one example, a manifold is included in the gas panel system 401 which will release the stabilization gas into the reaction chamber 408. The stabilization gas can have a flow rate ranging from 1,000 sccm to 10,000 sccm, preferably, about 2,000 sccm for a reactor 400 having a capacity of 5–6 liters.

In an embodiment of the present invention, reactor 400 is coupled to a remote plasma generator 801 which generates and provides hydrogen radicals to deposition chamber 408. Remote plasma generator 801 includes a magnetron 802 which generates microwaves with a microwave source. Magnetron 802 can preferably generate up to 10,000 watts of 2.5 Ghz microwave energy. It is to be noted that the amount of power required is dependent (proportional) to the size of chamber 408. For an anneal chamber used to process 300 mm wafers, 10,000 watts of power should be sufficient. Although a microwave source is used to generate a plasma in apparatus 800, other energy sources such as radio frequency (RF) may be used.

Magnetron 802 is coupled to an isolator and dummy load 804 which is provided for impedance matching. The dummy load absorbs the reflected power so no reflective power goes to the magnetron head. Isolator and dummy load 804 is coupled by a wave guide 806, which transmits microwave energy to an autotuner 808. Autotuner 808 consist of an impedance matching head and a separate detector module that uses three stepper motor driven impedance matching stubs to reduce the reflective power of the microwave energy directed to the power source. Autotuner 808 focuses the microwave energy into the center of a microwave applicator cavity (or chamber) 810 so that energy is absorbed by hydrogen treatment gas fed into the applicator cavity 810 by conduit 812. Although an autotuner is preferred a manual tuner may be employed.

Applicator 810 uses microwave energy received from magnetron 802 to create a plasma from the hydrogen treatment gas as it flows down through a quartz plasma tube located inside applicator 810. A source 814, such as a tank, of a hydrogen treatment gas such as but not limited to $H_2$ and $NH_3$ used for generating the hydrogen radicals is coupled to microwave applicator 810. Additionally, a source of an inert gas such as argon (Ar), or helium (He) can also be coupled to applicator 810. A prefire mercury lamp can be used to radiate ultraviolet light into the plasma tube to partially ionize the process gases and thereby make it easier for the microwave energy to ignite the plasma.

The microwave energy from magnetron 802 converts the hydrogen treatment gas into a plasma which consist of essentially three components; ionized or charged hydrogen atoms, activated (reactive) electrically neutral hydrogen atoms, and intermediate hydrogen containing species, all of which for the purposes of the present invention constitute "hydrogen radicals".

Applicator 810 can be bolted to the lid of apparatus 400. The concentrated plasma mixture flows downstream through conduit 814 to chamber 408. Because the hydrogen radicals are generated at location (chamber 810) which is separated or remote from the chamber 408 in which the substrate to be annealed is located, the hydrogen radicals are said to be "remotely generated".

Remote plasma source 801 can be coupled to processor/controller 900. Processor/controller 900 can include instructions stored in memory in a computer readable format, which controls the operation of remote plasma source 801 to achieve the hydrogen radical treatment process described above. Instructions can include for example, instructions to control hydrogen treatment gas flow rate and power to obtain the desired hydrogen radical flux necessary to treat the silicon nitride film, such as a flux between $5 \times 10^{15}$ atoms/cm$^2$ and $1 \times 10^{17}$ atoms/cm$^2$ and can also include instructions for controlling the temperature of the heating disk (and therefore the temperature of the wafer) as well as instructions to control the pressure within chamber 408 during the hydrogen radical treatment process.

Additionally, although the present invention has been described with respect to utilizing a single wafer apparatus, the deposition and treatment processes of the present invention can also be carried out in a semi-batch or tube type apparatus, if desired, without departing from the scope of the present invention.

Figure 5:
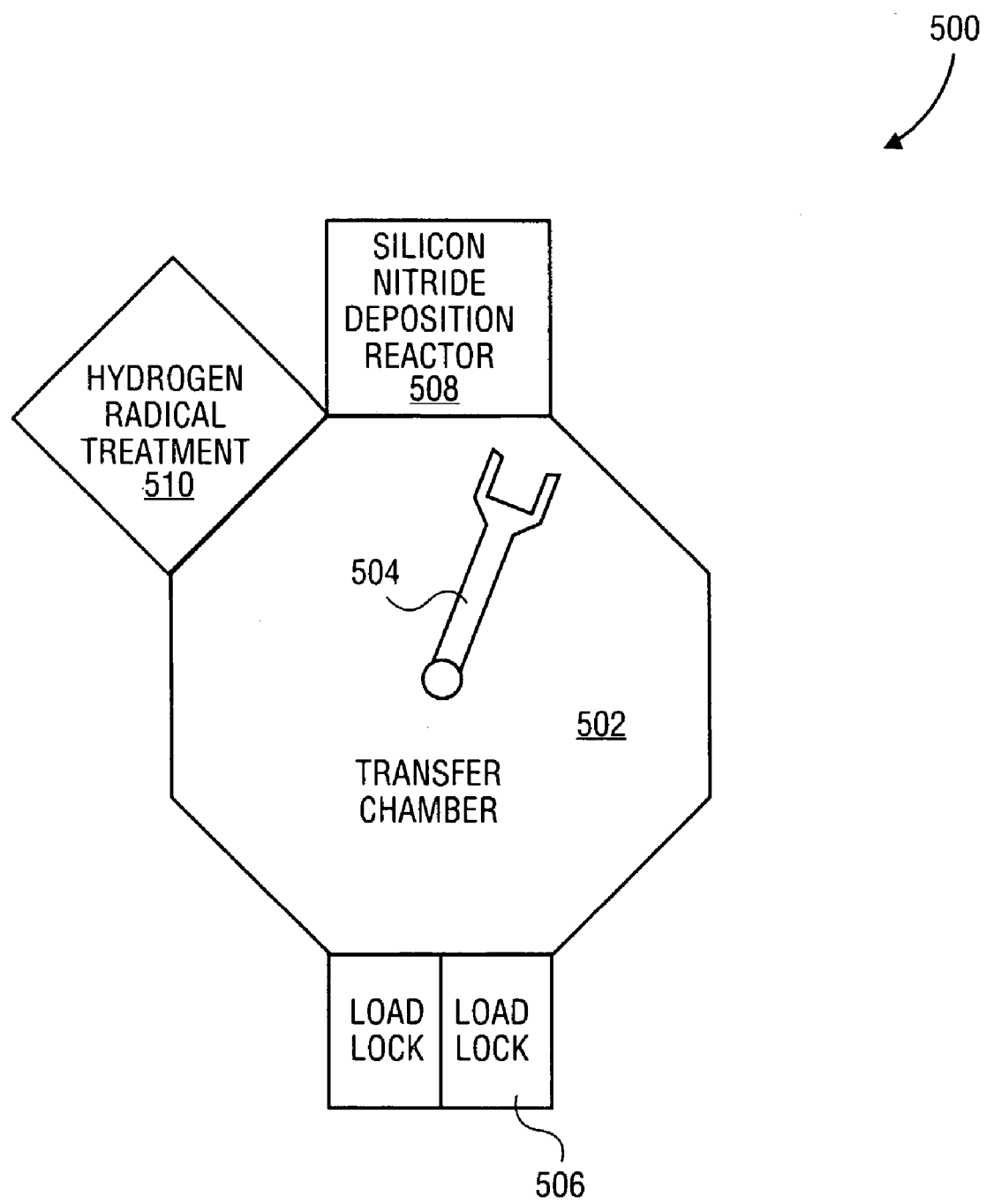
FIG. 5 is an illustration of cluster tool which can be used to form a silicon nitride in accordance with the present invention.

In an alternative embodiment of the present invention, the low temperature silicon nitride deposition process can be carried out in a cluster tool, such as cluster tool 500 as shown in FIG. 5. Cluster tool 500 includes a sealable transfer chamber 502 having a wafer handler 504, such as a robot, contained therein. A load lock or a pair of load locks 506 are coupled to the transfer chamber 502 through a sealable door to enable wafers to be brought into and out of cluster tool 500 by robot 504. Coupled to transfer chamber 502 by a sealable door is a silicon nitride deposition reactor 508, such as an Applied Materials Xgen single wafer, cold wall, thermal chemical vapor deposition reactor having a resistive heater. Also coupled to transfer chamber 502 by a sealable door is hydrogen radical treatment chamber 510 as shown in FIG. 5. The hydrogen radical treatment chamber can be for example, a plasma chamber, such as a Applied Materials Advanced Strip Passivation Plus (ASP) Chamber, a remote plasma chamber, such as Applied Materials Remote Plasma Nitridation RPN chamber, or a "hot wire" chamber. Typically, transfer chamber 502 is held at a reduced pressure and contains an inert ambient, such as $N_2$. In this way, wafers can be transferred from one chamber (e.g., silicon nitride deposition chamber 508) to a second chamber (e.g., hydrogen radical treatment chamber) and vice versa without exposing the wafer to an oxidizing ambient or to contaminants. Cluster tool 500 can also include a processor/controller 900 as described above to control the operation of the silicon nitride deposition reactor 500 as well as the hydrogen radical treatment chamber 510 to deposit a silicon nitride film as described above and to treat the silicon nitride film with hydrogen radicals as described above.

In use, a wafer or substrate, such as the wafer shown in FIG. 3A, is brought into transfer chamber 502 by robot 504 from load lock 506. The wafer is transferred into the silicon nitride deposition chamber 508, the door therebetween sealed and a silicon nitride film formed thereon with a low deposition temperature process. Once a silicon nitride film has been formed thereon, the wafer is removed by robot 504 from silicon nitride deposition chamber 508 and brought by robot 504 into hydrogen radical treatment chamber 510. The door between hydrogen radical treatment chamber 510 and transfer chamber 502 is then sealed and the silicon nitride film exposed to hydrogen radicals as described above. If a thicker silicon nitride film is desired, the wafer can be removed from chamber 510 and brought back into silicon nitride deposition chamber 508 in order to deposit additional silicon nitride. The wafer would once again be removed from silicon nitride deposition chamber 508 and brought back into hydrogen radical treatment chamber 510 and treated with hydrogen radicals once again. The wafer can be continually transferred between the deposition chamber 508 and the treatment chamber 510 until a silicon nitride film of the desired thickness and quality is obtained. Once a substantially thick silicon nitride layer is formed, the wafer is removed from cluster tool 500.

Thus, a method and apparatus for depositing and treating a high quality silicon nitride film at a low deposition temperature has been described.

We claim:

1. A method of forming a silicon nitride film comprising:
   heating a substrate to a temperature of 550° C. or less;
   thermally decomposing a silicon/nitrogen containing source gas or a silicon containing source gas and a nitrogen containing source gas using only thermal energy to form a silicon nitride film on said substrate while heating said substrate to a temperature of 550° C. or less, wherein said silicon/nitrogen containing source gas or said silicon containing source gas includes a first silicon atom bonded to a second silicon atom by a single bond, wherein a chlorine (Cl) atom or a nitrogen (N) atom is bonded to said first silicon atom, and wherein a chlorine atom or a nitrogen atom is bonded to said second silicon atom; and
   treating said silicon nitride film with hydrogen radicals.

2. The method of claim 1 wherein said hydrogen radicals are formed by plasma decomposition of a hydrogen containing source gas.

3. The method of claim 2 wherein said hydrogen containing source gas comprises ammonia ($NH_3$).

4. The method of claim 3 wherein said hydrogen containing source gas further comprises hydrogen gas ($H_2$).

5. The method of claim 2 wherein said hydrogen containing source gas comprises $H_2$.

6. The method of claim 5 wherein an inert gas selected from the group consisting of nitrogen gas ($N_2$), argon (Ar) and helium (He) is provided with said hydrogen containing source gas.

7. The method of claim 2 wherein said plasma decomposition of said source gas occurs in a chamber remote from the chamber in which said silicon nitride film is treated with hydrogen radicals.

8. The method of claim 1 wherein said treatment of said silicon nitride film with said hydrogen radicals occurs at a pressure between 100 mTorr and 5 Torr.

9. The method of claim 1 wherein said silicon nitride film has a chlorine concentration of greater than 1.0 atomic percent prior to treating said film and less than 1.0 atomic percent after treating said film.

10. The method of claim 1 wherein said silicon nitride film has a carbon concentration of greater than 10 atomic percent prior to treating said film and a carbon concentration of less than 5 atomic percent after treating said film.

11. The method of claim 1 wherein said thermal decomposition temperature is less than 500° C.

12. The method of claim 1 wherein said silicon nitride film is formed at a deposition rate of greater than 100 Å/per minute.

13. The method of claim 1 wherein said silicon nitride film is formed to a thickness of less than 150 Å prior to treating with said hydrogen radicals.

14. The method of claim 1 wherein said silicon nitride film has a hydrogen concentration of greater than 15 atomic percent prior to said hydrogen radical treatment.

15. The method of claim 14 wherein after treating said silicon nitride film, said silicon nitride film has a hydrogen concentration of less than 10 atomic percent.

16. The method of claim 1 wherein the other three bonds of each of said silicon atoms are bonded to either a nitrogen atom or a chlorine atom.

17. The method of claim 1 wherein said silicon source gas or said silicon/nitrogen source gas includes an organo group bonded to a nitrogen atom bonded to the first silicon atom.

18. The method of claim 1 wherein said silicon containing source gas or said silicon/nitrogen containing source gas includes a chlorinated or non-chlorinated organo amino-di or mono-silane $R_2N$—$Si(R'_2)$—$Si_x(R'_2)_y$—$NR_2$ (x=y=0 or 1; R,R'=any combination of Cl, or methyl, or ethyl, or iso=propyl, or other alkyl groups, or another alkyamino group, or cyclic group containing N, or a silyl group).

19. The method of claim 18 wherein said silicon containing source gas or said silicon/nitrogen containing source gas is selected from the group consisting of 1,2-diethyl-tetrakis (diethylamino) disilane, 1,2-dichloro-tetrakis (diethylamino) disilane, and hexakis (N-pyrrolidinio) disilane.

20. The method of claim 1 wherein said silicon containing source gas is hexachlorodisilane (HCD).

21. The method of claim 1 further comprising forming a second silicon nitride film onto said treated silicon nitride film by thermally decomposing a silicon/nitrogen containing source gas or a silicon containing source gas and a nitrogen containing source gas; and
   treating said second silicon nitride film with hydrogen radicals.

22. The method of claim 21 further comprising forming a third silicon nitride film on said second treated silicon nitride film by thermally decomposing a silicon/nitrogen containing source gas or a silicon containing source gas and a nitrogen containing source gas; and
   treating said third silicon nitride film with hydrogen radicals.

23. The method of claim 1 wherein said silicon nitride film is treated with hydrogen radicals at a flux between $5 \times 10^{15}$ atoms/cm$^2$–$1 \times 10^{17}$ atoms/cm$^2$.

24. The method of claim 23 wherein the pressure while treating said silicon nitride film with said hydrogen radicals is between 100 mTorr–5 Torr.

25. The method of claim 1 wherein the pressure in said chamber while forming said silicon nitride film is between 10–350 Torr.

26. The method of claim 1 wherein said deposited silicon nitride film is treated for between 15–120 seconds.

27. The method of claim 1 wherein said silicon nitride deposited film is treated with hydrogen radicals at a temperature between 450–600° C.

28. The method of claim 1 wherein prior to treating said silicon nitride film with hydrogen radicals, said silicon nitride film having a refractive index of less than 1.85.

29. The method of claim 28 wherein after treating said silicon nitride film with hydrogen radicals, said silicon nitride film having a refractive index of greater than or equal to 1.90.

30. The method of claim 1 wherein prior to treating said silicon nitride film with hydrogen radicals, said silicon nitride film has an etch rate of more than two times that of silicon oxide utilizing a buffered oxide etch.

31. The method of claim 30 wherein after treating said silicon nitride film with hydrogen radicals, said silicon nitride film has an etch rate of approximately the same as the etch rate of silicon oxide utilizing a buffered oxide etch.

32. A method of forming a silicon nitride film comprising:
depositing a silicon nitride film by thermally decomposing a silicon/nitrogen containing source gas or a silicon containing source gas and a nitrogen containing source gas using only thermal energy at a temperature of less than 550° C. and at a deposition rate of greater than 100 Å/minute to a thickness of less than 150 Å, wherein said silicon/nitrogen containing source gas or said silicon containing source gas includes a first silicon atom bonded to a second silicon atom by a single bond, wherein a chlorine (Cl) atom or a nitrogen (N) atom is bonded to said first silicon atom, and wherein a chlorine atom or a nitrogen atom is bonded to said second silicon atom; and
treating said deposited silicon nitride film with hydrogen radicals formed by plasma decomposition of a hydrogen containing gas to form a treated silicon nitride film.

33. The method of claim 32 wherein said silicon containing source gas or said silicon/nitrogen containing source gas is selected from the group consisting of organo-di-silane, organo-mono-silane, organoamino-di-silane, organoamino-mono-silane.

34. The method of claim 32 wherein said hydrogen containing source gas comprises ammonia ($NH_3$).

35. The method of claim 32 wherein said hydrogen containing source gas comprises hydrogen gas ($H_2$).

36. The method of claim 32 wherein said hydrogen containing source gas comprises ammonia ($NH_3$) and hydrogen ($H_2$).

37. The method of claim 32 wherein said deposited silicon nitride film is treated with hydrogen radicals having a flux of between $5\times10^{15}$ atoms/cm$^2$–$1\times10^{17}$ atoms/cm$^2$.

38. The method of claim 32 wherein prior to treating said deposited silicon nitride film with hydrogen radicals, said silicon nitride film has a hydrogen concentration of greater than 15 atomic percent significantly in Si—H forms and wherein after treating said deposited silicon nitride film with hydrogen radicals, said treated silicon nitride film has a hydrogen concentration of less than 10% and substantially reduced Si—H bonds.

39. The method of claim 32 wherein said plasma decomposition occurs in a chamber remote from said chamber in which said silicon nitride film is treated with hydrogen radicals.

40. The method of claim 32 wherein said silicon nitride film is treated within the same chamber in which it is deposited.

41. A method of forming a silicon nitride film comprising:
depositing a silicon film by thermally decomposing a silicon/nitrogen containing source gas or a silicon containing source gas and a nitrogen containing source gas using only thermal energy wherein said silicon containing source or said silicon/nitrogen containing source gas includes chlorine and carbon; and
treating said deposited silicon nitride film with hydrogen radicals formed by plasma decomposition of a hydrogen containing gas to form a treated silicon nitride film.

42. A method for forming a silicon nitride film comprising:
depositing a silicon nitride film by thermally decomposing a silicon/nitrogen containing source gas or a silicon containing source gas and a nitrogen containing source gas using only thermal energy, wherein said silicon/nitrogen containing source gas or said silicon containing source includes carbon and wherein after depositing said silicon nitride film said silicon nitride film has a hydrogen concentration of greater 15 atomic percent and a carbon concentration of greater than 10 atomic percent; and
treating said deposited silicon nitride film with hydrogen radicals until said silicon nitride film has a hydrogen concentration of less than 10 atomic percent and a carbon concentration of less than 5 atomic percent.

43. The method of claim 42 wherein said silicon nitride film has chlorine concentration of greater than 1.0 atomic percent prior to treating said film and less than 1.0 atomic percent after treating said film.

* * * * *

UNITED STATES PATENT AND TRADEMARK OFFICE
CERTIFICATE OF CORRECTION

PATENT NO. : 7,172,792 B2  Page 1 of 1
APPLICATION NO. : 10/327467
DATED : February 6, 2007
INVENTOR(S) : Wang et al.

It is certified that error appears in the above-identified patent and that said Letters Patent is hereby corrected as shown below:

Column 3, Line 1: Before "ethyl", insert --Cl, or methyl, or--

Column 16, Claim 23, Line 56: Change "atoms/cm$^{2-1x1017}$" to --atoms/cm$^2$ - $1x10^{17}$--

Column 17, Claim 37, Line 47: Change "atoms/cm$^{2-1x1017}$" to --atoms/cm$^2$ - $1x10^{17}$--

Column 18, Claim 42, Line 35: After "greater", insert --than--

Signed and Sealed this

Fifteenth Day of May, 2007

JON W. DUDAS
*Director of the United States Patent and Trademark Office*

UNITED STATES PATENT AND TRADEMARK OFFICE
CERTIFICATE OF CORRECTION

PATENT NO.        : 7,172,792 B2                                          Page 1 of 1
APPLICATION NO.   : 10/327467
DATED             : February 6, 2007
INVENTOR(S)       : Shulin Wang et al.

It is certified that error appears in the above-identified patent and that said Letters Patent is hereby corrected as shown below:

In the Claims:

Column 16, Claim 18, Lines 25-31, please delete the claim in its entirety;

Column 16, Claim 19, Lines 32-36, please delete the claim in its entirety; and

Column 17, Claim 33, Lines 33-37, please delete the claim in its entirety.

Signed and Sealed this

Eighth Day of September, 2009

David J. Kappos
*Director of the United States Patent and Trademark Office*